US010512193B1

(12) United States Patent
Chen et al.

(10) Patent No.: US 10,512,193 B1
(45) Date of Patent: Dec. 17, 2019

(54) COOLING CHASSIS FOR A COOLING SYSTEM

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW); Tsung-Ta Li, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/251,776

(22) Filed: Jan. 18, 2019

Related U.S. Application Data

(60) Provisional application No. 62/723,755, filed on Aug. 28, 2018.

(51) Int. Cl.
*H05K 7/20* (2006.01)
*G06F 1/20* (2006.01)

(52) U.S. Cl.
CPC ......... *H05K 7/20727* (2013.01); *G06F 1/206* (2013.01); *H05K 7/20145* (2013.01); *H05K 7/20772* (2013.01); *G06F 2200/201* (2013.01)

(58) Field of Classification Search
CPC .................. H05K 7/20145; H05K 7/20772
See application file for complete search history.

(56) References Cited

U.S. PATENT DOCUMENTS

| 2007/0133172 A1* | 6/2007 | Cheon | G06F 1/20 361/699 |
| 2013/0070417 A1* | 3/2013 | Du | G06F 1/20 361/695 |

* cited by examiner

*Primary Examiner* — Hung V Ngo
(74) *Attorney, Agent, or Firm* — Nixon Peabody LLP; Zhou Lu

(57) ABSTRACT

The present disclosure describes a cooling chassis for a cooling system of a computer system. The cooling chassis includes a housing configured to allow air to pass through in a housing air flow direction. A first radiator is within the housing. The first radiator is oriented at a first oblique angle relative to the housing air flow direction. A first fan is configured to direct air through the first radiator in a first fan air flow direction oblique to the housing air flow direction.

19 Claims, 10 Drawing Sheets

COOLING CHASSIS FOR A COOLING SYSTEM

CROSS-REFERENCE TO RELATED APPLICATIONS

This application claims priority to and the benefit of U.S. Provisional Application Ser. No. 62/723,755, filed Aug. 28, 2018, which is hereby incorporated by reference herein in its entirety.

FIELD OF THE INVENTION

The present invention applies to cooling systems in computer systems and more specifically, to a cooling chassis with a radiator for a cooling system.

BACKGROUND

The total power consumed by high-performance computer systems, such as server computer systems, can exceed 10 kilowatts (kW), or even 20 kW for some specific types computer systems. In these computer systems, the power consumption of a single computer component, such as a single computing chipset (e.g., central processing unit (CPU), graphics processing unit (GPU), a field-programmable gate array (FPGA), etc.) can range from about 200 to 500 Watts.

In a rackmount server, the computer components (e.g., computing chipsets) have piping for connecting to the liquid cooling chassis (LCC). The LCC can occupy about 1 U, 2 U, 3 U, 4 U, or even 5 U in height within the rackmount server. A coolant moving device (i.e., pump) can be located on the chipset or on the LLC.

The cooling capacity of the LCC generally is dependent on the length and surface area of the radiator within the cooling chassis, in addition to the velocity of the air flow across the radiator. However, as the length and surface area of the radiator increase, the velocity of the air flow decreases. Therefore, a tradeoff exists in conventional cooling systems between surface area of the radiator and the air flow velocity.

FIG. 1A illustrates a conventional liquid cooling system 100 for providing cooling within a computer system. FIG. 1B illustrates an exploded view of the liquid cooling system 100. Referring to FIG. 1A, the liquid cooling system 100 contains a 5 U high housing 102 with a radiator 104 for heat exchange, a manifold 106 and piping 108 for transporting coolant through the system 100, one or more fans 110, and a fairing 112 for directing air through the housing 102 and over the radiator 104. According to the conventional design, the radiator 104 generally has the shape of a block. For example, the radiator can be 350 mm wide, 470 mm long, and 222 mm tall. As illustrated in FIGS. 1A and 1B, all of the fans 110 direct air over the radiator 104 in substantially the same direction. This is generally described as the air flow direction through the housing 102, as represented by the arrow 114.

When the power consumption of the computer system associated with the liquid cooling system 100 increases, and more cooling is required for one or more computer components, the speed of the fans 110 must increase. The increased fan speed requires more power and also generates more noise. Thus, the design of liquid cooling system 100, and conventional liquid cooling systems in general, requires too much power and generates too much noise for the amount of cooling the system 100 provides.

Accordingly, there is a need for a more efficient liquid cooling system that requires less power while providing the same amount of cooling, or even more cooling.

SUMMARY

The present disclosure describes a cooling chassis for a cooling system, such as a fluidic or liquid cooling system, within a computer system, such as a server computer system. The cooling chassis includes a radiator that is tilted at an oblique angle relative to the air flow through the housing of the cooling chassis. The oblique angle of the radiator maximizes the surface area of the radiator exposed to the air flow, while reducing the reduction of the velocity of the air flow.

According to one embodiment of the present disclosure, a cooling chassis for cooling a computer system is disclosed. The cooling chassis includes a housing configured to allow air to pass through in a housing air flow direction. The chassis further includes a first radiator within the housing. The first radiator is oriented at a first oblique angle relative to the housing air flow direction. The chassis further includes a first fan configured to direct air through the first radiator in a first fan air flow direction oblique to the housing air flow direction.

According to further aspects of the embodiment, the first radiator can be planar, and a first plane defined by the first radiator can be oriented at the first oblique angle relative to the housing air flow direction. The first fan air flow direction can be perpendicular to the first radiator. The first fan can be coupled to the first radiator. The cooling chassis can further include a second fan configured to direct air at least partially through the first radiator, in a second fan air flow direction, parallel to the housing air flow direction. The cooling chassis can further include a second radiator within the housing. The second radiator can be oriented at a second oblique angle relative to the housing air flow direction. The second radiator can be planar, and a second plane defined by the second radiator can be oriented at the second oblique angle relative to the housing air flow direction. The second oblique angle can be substantially equal to the first oblique angle. The cooling chassis can further include a second fan configured to direct air through the second radiator in a second fan air flow direction, oblique to the housing air flow direction. The first radiator and the second radiator can form a V-shaped radiator system. The vertex of the V-shaped radiator system can be oriented in the housing air flow direction. The first fan can include a plurality of fans. The first oblique angle can be about 5° to less than 90°. The housing air flow direction can substantially correspond, and be parallel to, a length of the housing.

According to one embodiment of the present disclosure, a cooling chassis for a cooling system in a server computer system is disclosed. The chassis includes a housing having a first open end and a second open end that is opposite to the first open end. The housing has a length, from the first open end to the second open end. The length substantially corresponds to a housing air flow direction through the housing. The chassis further includes a radiator system within the housing. The radiator system has a first radiator tilted at a first oblique angle relative to the air flow direction, and a second radiator titled at a second oblique angle relative to the air flow direction. The chassis further includes a first plurality of fans adjacent to the first radiator, and configured to direct air flow perpendicularly through the first radiator in a first fan air flow direction. The chassis further includes a second plurality of fans coupled to the second radiator, and configured to direct air flow perpendicularly through the second radiator in a second fan air flow direction. The chassis further includes a third plurality of fans within the housing that is between the first radiator and the second radiator. The third plurality of fans is configured to direct air flow through the first radiator and the second radiator in the air flow direction.

According to further aspects of the embodiment, the first radiator can be planar, and a first plane defined by the first radiator is oriented at the first oblique angle relative to the housing air flow direction. The second radiator also can be planar, and a second plane defined by the second radiator is oriented at the second oblique angle, relative to the housing air flow direction. The first radiator and the second radiator can form a V-shape, and the vertex of the V-shape is oriented in the housing air flow direction. The first oblique angle can be about 5° to less than 90° relative to the housing air flow direction, and the second oblique angle can be about 5° to less than 90° relative to the housing air flow direction. The third plurality of fans can be in a farthest forward position between the first radiator and the second radiator. The first plurality of fans can be in a farthest back position relative to the first radiator. The second plurality of fans can be in a farthest back position relative to the second radiator.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments and are, therefore, not to be considered as limitations on the scope of the various embodiments or claims.

DETAILED DESCRIPTION

Figure 1A:
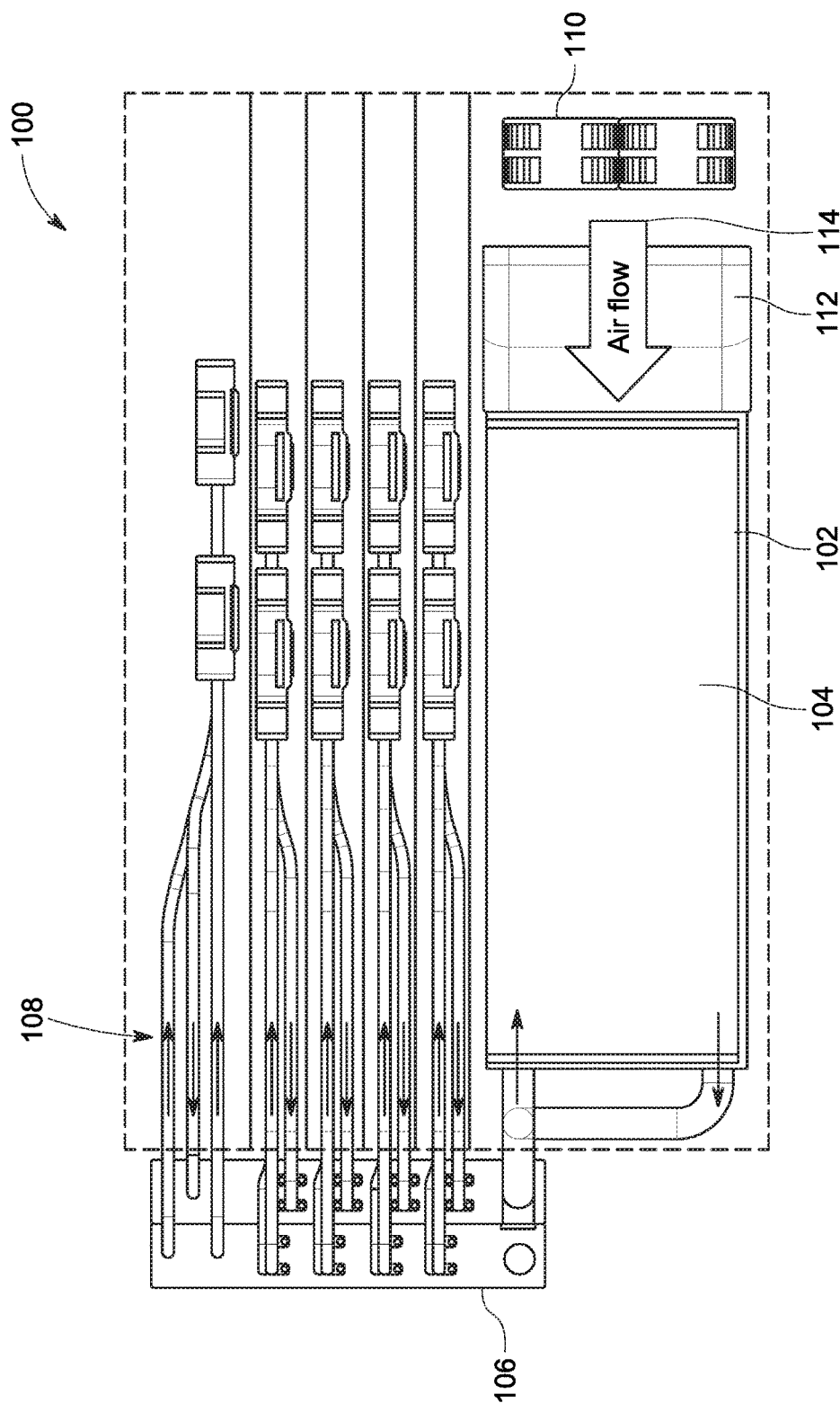
FIG. 1A illustrates a perspective view of a conventional liquid cooling system.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device," or "computing system," and "computer system" refer to any electronically-powered or battery-powered equipment that has hardware, software, and/or firmware components, where the software and/or firmware components can be configured for operating features on the device. With regards to the present disclosure, the term "operating environment" can refer to any operating system or environment that functions to allow software to run on a computer system.

The present disclosure describes a cooling chassis for a cooling system, such as a liquid cooling system, that has increased efficiency and cooling power as compared to conventional cooling systems. The radiator system within the cooling chassis is positioned to provide greater surface area than conventional cooling systems. The fans within the cooling chassis can also be positioned according to an orientation of the radiator system, or radiators of the radiator system. This orientation is in contrast to conventional cooling systems that place all of the fans pointed in the direction of air flow through a housing of the cooling system.

Based on the design of the cooling chassis and associated air flow, the width or thickness of the radiators within the cooling chassis can be kept smaller than conventional radiators. The smaller width or thickness of the radiators allows for a faster air flow velocity through the radiators. The faster air flow velocity through the radiators increases the cooling capacity, along with the efficiency of the cooling chassis in general.

Figure 2A:
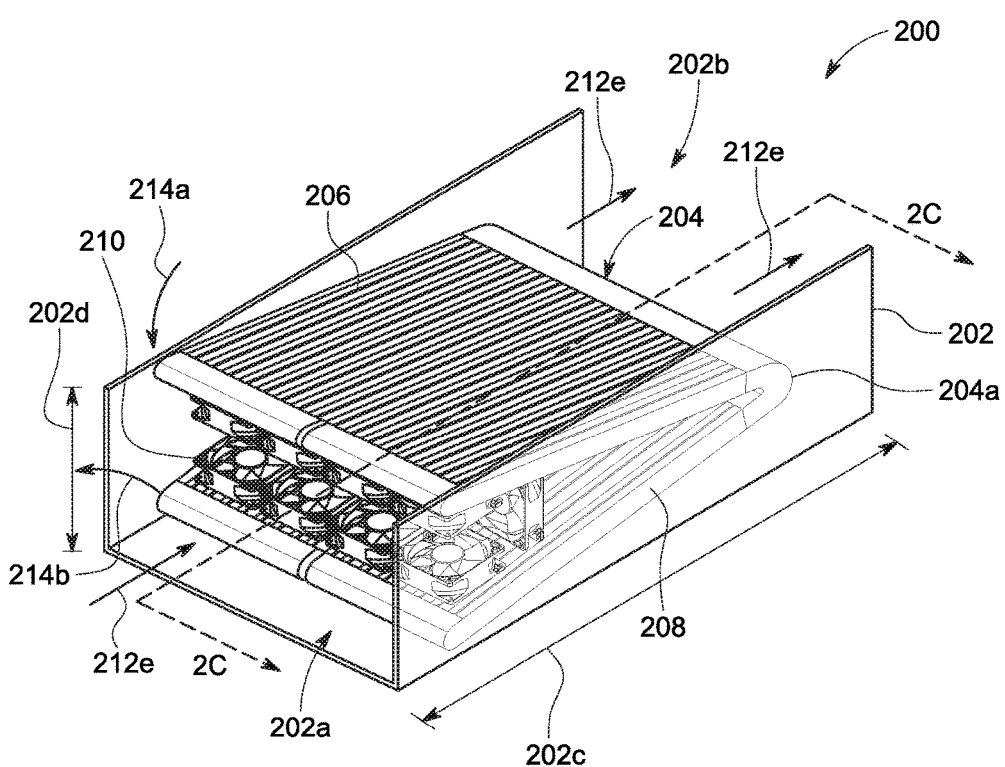
FIG. 2A illustrates a perspective view of a cooling chassis according to one embodiment of the present disclosure.
Figure 2B:
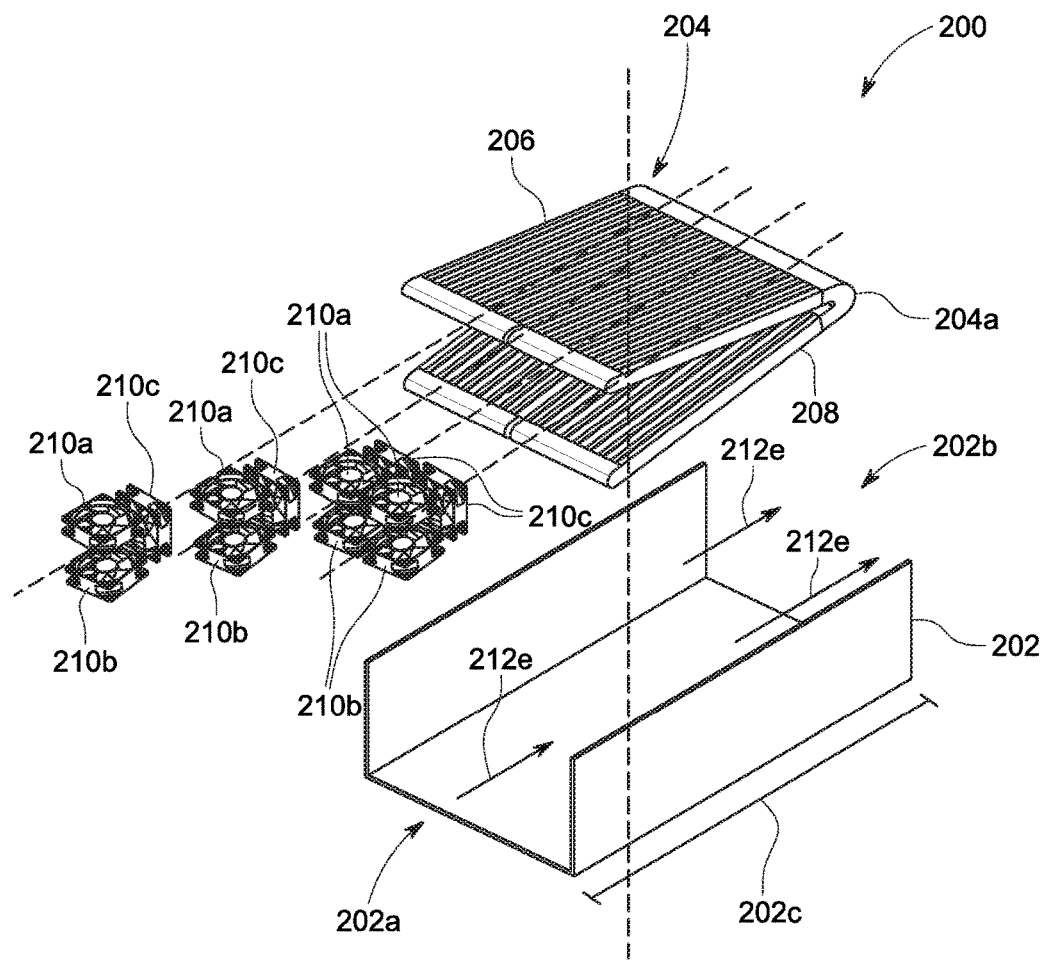
FIG. 2B illustrates an exploded view of the cooling chassis of FIG. 2A.
Figure 2C:
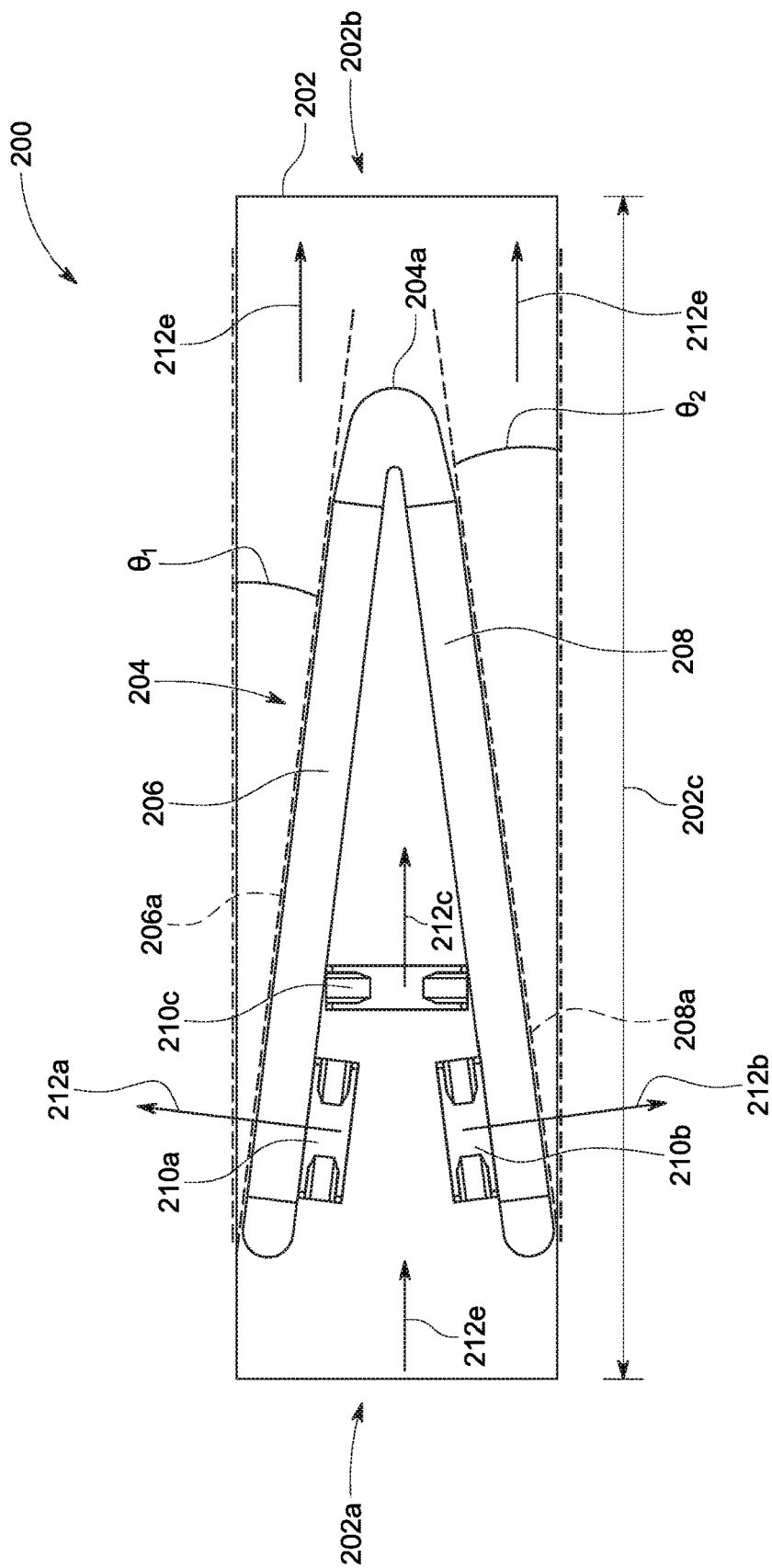
FIG. 2C illustrates a cross-section view of the cooling chassis of FIG. 2A through the line 2C-2C.

FIGS. 2A-2C illustrate a cooling chassis 200 for a cooling system within a computer system for cooling one or more computer components, according to one embodiment of the present disclosure. In particular, FIG. 2A illustrates a perspective view of the cooling chassis 200. FIG. 2B illustrates an exploded view of the cooling chassis 200. FIG. 2C illustrates a cross-section view of the cooling chassis 200 through the line 2C-2C of FIG. 2A.

The cooling chassis 200 includes a housing 202. The housing 202 is configured to be inserted within a server computer system (not shown). In one or more embodiments, the housing 202 is configured to be inserted into a rackmount server computer system. The housing 202 has a height 202d that can be, for example, 1 U, 2 U, 3 U, 4 U, 5 U, or more, depending on the desired size of the cooling chassis 200 and the cooling capacity required for the computer system. The housing 202 further has a first open end 202a, and a second open end 202*b* that is opposite to the first open end 202*a*. The housing 202 also has a length 202*c* between the open ends 202*a* and 202*b*. The open ends 202*a* and 202*b* allow air to flow through the housing 202 in an air flow direction substantially represented by the arrows 212*e*. Thus, air generally flows into the first open end 202*a* through the housing 202, and out of the second open end 202*b*. The air flow direction 212*e* is generally parallel to the length 202*c* of the housing 202.

Although illustrated as being open on top, the housing 202 can have a top to form an enclosed passageway through which the air passes. Alternatively, the housing 202 effectively can have a top based on another component within the computer system (e.g., within the rackmount) being above and substantially enclosing the housing 202.

Within the housing 202 is a radiator system 204. The radiator system 204 connects to, for example, a manifold (not shown) to pass coolant through the radiator system 204. The manifold can be a conventional manifold, such as the manifold 106 of FIG. 1A, which also connects to one or more computer components. The radiator system 204 exchanges heat between the coolant running through the cooling chassis 200, and air passing through the housing 202 and the radiator system 204. The coolant can be any type of coolant used in a conventional cooling chassis, such as water, for example. Where liquid is used as the coolant, the cooling chassis can be part of a liquid cooling system.

The radiator system 204 includes radiators 206 and 208. The radiators 206 and 208 are planar in shape and are tilted at an oblique angle relative to the air flow direction 212*e* through the housing 202. More specifically, the plane 206*a* (FIG. 2C) defined by the radiator 206 is angled at an angle $\theta_1$, relative to the air flow direction 212*e* through the housing 202. The plane 208*a* (FIG. 2C) defined by the radiator 208 is angled at an angle $\theta_2$, relative to the air flow direction 212*e* through the housing 202. In one or more embodiments, the angles $\theta_1$ and $\theta_2$ can be the same value or different values. For example, the angle $\theta_1$ can be about 5° to less than 90°, and the angle $\theta_2$ can be about 5° to less than 90°.

The angles $\theta_1$ and $\theta_2$ orient the radiators 206 and 208 in a V-shape, such that the radiator system 204 forms a V-shaped structure. The vertex 204*a* of the V-shaped radiator system 204 is oriented in the air flow direction 212*e*, as illustrated in FIG. 2C.

The radiators 206 and 208 can be various sizes, depending on the size of the cooling chassis 200 and the cooling capacity required. For exemplary purposes only, the radiators 206 and 208 can each be about 400 mm wide, about 490 mm long, and about 45 mm tall or thick when the height 202*d* of the housing 202 is about 5 U.

Although the radiators 206 and 208 are illustrated as being substantially flat or planar, the shapes of the radiators 206 and 208 can have variations to increase the surface area in one or more embodiments. For example, in one or more embodiments, the radiators 206 and 208 can have a zig-zag pattern, a wavy pattern, a boustrophedonic pattern, or the like, or combinations thereof, along their cross-section (FIG. 2C) to increase the surface area. However, the planes 206*a* and 208*a* defined by the overall shapes and orientations of the radiators 206 and 208, as illustrated in FIG. 2C, remain tilted at an oblique angle relative to the air flow direction 212*e* despite such variations.

Although the present disclosure describes the radiators 206 and 208 as forming the radiator system 204 in one or more embodiments, the radiators 206 and 208 can together form a single radiator. Alternatively, in one or more embodiments, the radiators 206 and 208 can be separate radiators that are connected together to form the single radiator system 204.

Although only one radiator system 204 is illustrated in FIGS. 2A-2C, the housing 202 can include more than one radiator system 204 in one or more embodiments. In one or more embodiments, the multiple radiator systems 204 can be stacked one on top of the other. Alternatively, or in addition, in one or more embodiments, the multiple radiator systems 204 can be in a line within the housing 202, one behind the other, or vertically offset in a stacked arrangement. Based on the V-shape of the radiator system 204, multiple radiator systems 204 in a line can be nested in each other. Alternatively, multiple radiator systems 204 can be horizontally offset so as to not be nested. For multiple radiator systems 204, the angles θ1 and θ2 can be angled at the same angles or at different angles relative to each other.

The flow of coolant through the radiators 206 and 208 is illustrated in FIG. 2A according to the arrows 214*a* and 214*b*. Specifically, the radiators 206 and 208 can be configured so that the hot coolant comes in at the top of the radiator 206 according to arrow 214*a*, opposite from the vertex 204*a*. The coolant then exits at the top of the radiator 208 according to arrow 214*b*, opposite from the vertex 204*a*. The coolant can enter and exit on the same side for both of the radiators 206 and 208, as illustrated by the arrows 214*a* and 214*b*. Alternatively, the coolant can enter on, for example, the top left side of the radiator 206, and can exit on, for example, the bottom right side of the radiator 208. Where multiple radiator systems 204 are within the housing 202, the multiple radiator systems 204 can be connected in series, in parallel, or a combination thereof, for passing the cooling through the systems 204.

Within the housing 202 are fans 210. The fans 210 direct air through the housing 202 and the radiator system 204. The combination of the fans 210 within the housing 202 directs air through the housing generally, according to the air flow direction 212*e*. However, the specific air flow for individual fans 210, or sets of fans 210, can be different from the air flow direction 212*e*, as described below. The specific air flow allows the speed of the fans 210 to be lower than the speed of the fans 110.

The fans 210 include fans 210*a* that are configured to direct air through the radiator 206. The fans 210*a* are placed to face the radiator 206 directly, i.e., not on an angle with respect to the radiator 208 but positioned with respect to the angle of the radiator. Specifically, and as shown in FIG. 2C, the fans 210*a* are oblique to the air flow direction 212*e* through the housing 202; and have a fan air flow direction 212*a* that is substantially perpendicular to the radiator 206, or the plane 206*a* of the radiator 206. The fan air flow direction 212*a* also is oblique to the air flow direction 212*e* through the housing 202. Although only four fans are illustrated in FIG. 2B for the fans 210*a*, there can be less than or more than four fans 210*a*, e.g., one fan, two fans, three fans, five fans, etc. The fans 210*a* can be coupled to the housing 202, the radiator 206, or both.

The fans 210 also include fans 210*b* that are configured to direct air through the radiator 208. The fans 210*b* are placed to face the radiator 208 directly, i.e., not on an angle with respect to the radiator 208 but positioned with respect to the angle of the radiator. Specifically, and as shown in FIG. 2C, the fans 210*b* are oblique to the air flow direction 212*e* through the housing 202; and have a fan air flow direction 212*b* that is substantially perpendicular to the radiator 208, or the plane 208*a* of the radiator 208. The fan air flow direction also is oblique to the air flow direction 212*e* through the housing 202. Although only four fans are illustrated in FIG. 2B for the fans 210b, there can be less than or more than four fans 210b, e.g., one fan, two fans, three fans, five fans, etc. Further, there may be the same, fewer, or more fans 210b than fans 210a. The fans 210b can be coupled to the housing 202, the radiator 208, or both.

In one or more embodiments, the fans 210a, 210b, or both can be placed as far back as possible from the vertex 204a of the radiator system 204 (e.g., the farthest back position), such as what is illustrated in FIGS. 2A-2C. However, in one or more embodiments, the fans 210a, 210b, or both can be placed forward of the farthest back position.

The fans 210 also include fans 210c that are configured to direct air through the radiators 206 and 208 at an oblique angle. Specifically, the fans 210c are configured to direct air through the radiator 206 at the angle $\theta_1$, based on the angle of the radiator 206 relative to the air flow direction 212e. The fans 210c similarly are configured to direct air through the radiator 208 at the angle $\theta_2$, based on the angle of the radiator 208 relative to the air flow direction 212e. Thus, unlike the fans 210a and 210b, the fans 210c have a fan air flow direction 212c that is parallel to the air flow direction 212e through the housing 202.

Although only four fans are illustrated in FIG. 2B for the fans 210c, there can be less than or more than four fans 210c, e.g., one fan, two fans, three fans, five fans, etc. Further, there may be the same, fewer, or more fans 210c than fans 210a, fans 210b, or both. The fans 210c can be coupled to the housing 202, the radiator 206, the radiator 208, or a combination thereof.

In one or more embodiments, the fans 210c can be placed as near as possible to the vertex 204a of the radiator system 204 (e.g., the farthest forward position), while still directing air through the radiators 206 and 208 at an oblique angle. The fans 210a and 210b can be placed in back of the fans 210c, as illustrated in FIGS. 2A-2C. However, in one or more embodiments, the fans 210c can be placed back from the farthest forward position, while still directing air through the radiators 206 and 208 at an oblique angle. In such an arrangement, the fans 210a and 210b can still be placed in the back of the fans 210c. Alternatively, the fans 210a, 210b, or both can be placed in front of the fans 210c, closer to the vertex 204a.

As illustrated in FIGS. 2A-2C, the fans 210 can be sized relative to the sizes of the radiators 206 and 208 to prevent air from flowing through the housing 202, without passing through one of the fans 210. For example, referring to FIG. 2C, there is no direct path for air to flow through the housing 202, from the open end 202a to the open end 202b, and while remaining parallel to the air flow direction 212e, without passing through one of the fans 210.

The fans 210 placed in the arrangement shown in FIGS. 2A-2C provides maximum cooling. However, other arrangements of the fans 210 are possible. In one or more embodiments, one or more of the fans 210a, 210b, or 210c can be omitted. For example, there can be less than four fans of the fans 210a, 210b, or 210c. Further, in one or more embodiments, one or more sets of the fans 210a, 210b, or 210c can be omitted entirely, or placed in another arrangement within the housing 202. For example, the fans 210c can be placed at the open end 202a or 202b of the housing 202. One or more additional fans 210 can be added or removed depending on the total size of the housing 202. For example, a larger housing 202 can support more fans 210. One embodiment of a cooling chassis with additional fans is illustrated in FIG. 3.

Figure 3:
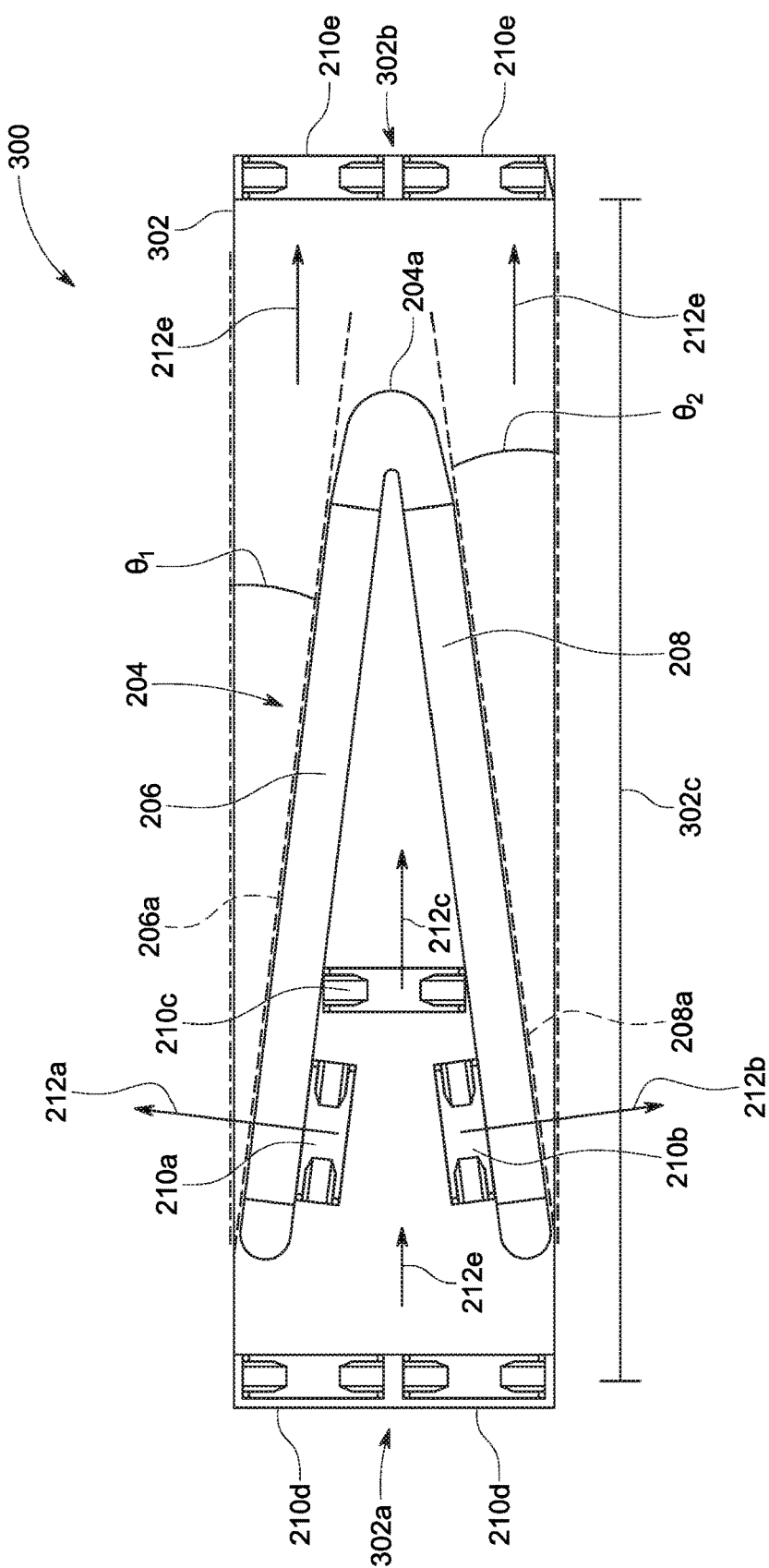
FIG. 3 illustrates a cross-section view of another cooling chassis, similar to the cooling chassis of FIG. 2C, but with additional fans.

Specifically, FIG. 3 illustrates a cross-section view of a cooling chassis 300, which is similar to the cooling chassis 200 of FIG. 2C, but with additional fans 210d and 210e. Elements in the cooling chassis 300 that are similar to the elements in the cooling chassis 200 are numbered according to the same number, or same numbering scheme. The difference with the cooling chassis 300 as compared to the cooling chassis 200 is the addition of the fans 210d at the open end 302a and the fans 210e at the open end 302d. There can be eight fans 210d arranged in two stacked rows of four fans. Similarly, there can be eight fans 210e arranged in two stacked rows of four fans. However, there can be fewer or more fans 210d or fans 210e depending on the size of the housing 302.

Figure 1B:
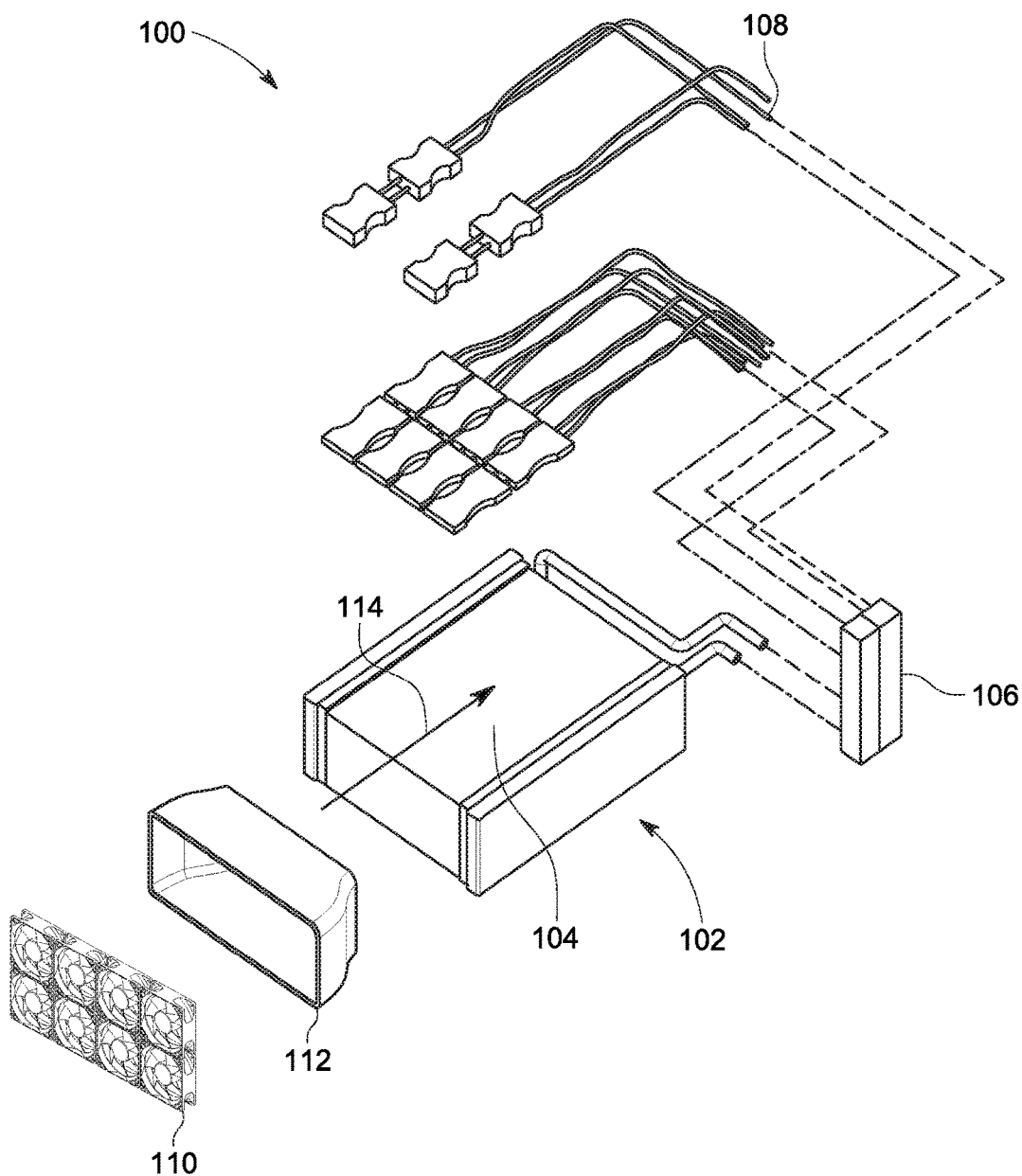
FIG. 1B illustrates an exploded view of the conventional liquid cooling system of FIG. 1A.

With the sizes of the radiators 206 and 208 as discussed above (i.e., about 400 mm wide, about 490 mm long, and about 45 mm tall), the radiators 206 and 208 provide a combined cooling power of about 16.1 kW. In contrast, a conventional cooling chassis, as described with respect to FIGS. 1A and 1B, having a radiator that is 350 mm wide, 470 mm long, and 222 mm tall has the cooling power of 16.4 kW. Yet, the efficiency of the cooling chassis 200 of the present disclosure saves about 40% or more of the energy as compared to the conventional cooling chassis. Thus, by using the titled radiators 206 and 208, and at least the fans 210a and 210b placed according the angles $\theta_1$ and $\theta_2$, the cooling capacity is almost equal to a conventional liquid cooling chassis, but the efficiency of the cooling chassis 200 is improved as compared to the liquid cooling system 100.

Figure 4A:
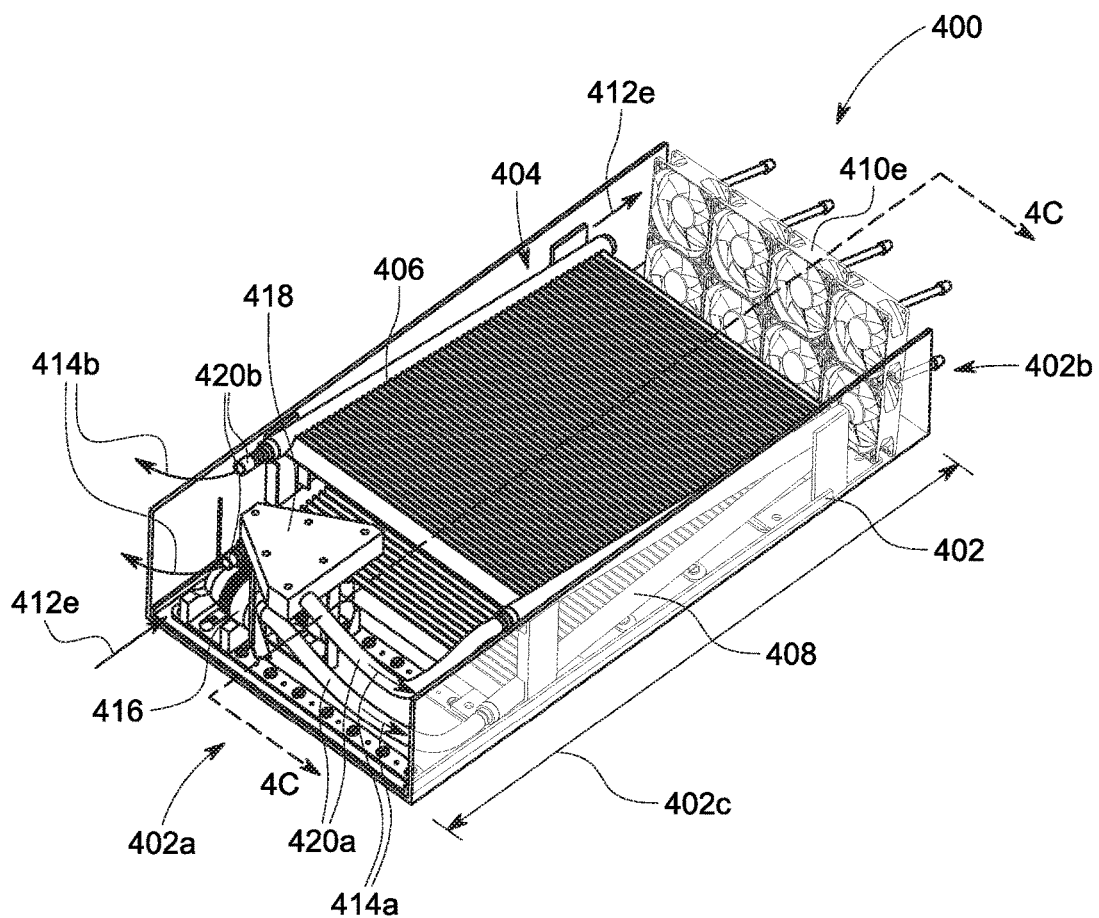
FIG. 4A illustrates a perspective view of a cooling chassis according to another embodiment of the present disclosure.
Figure 4B:
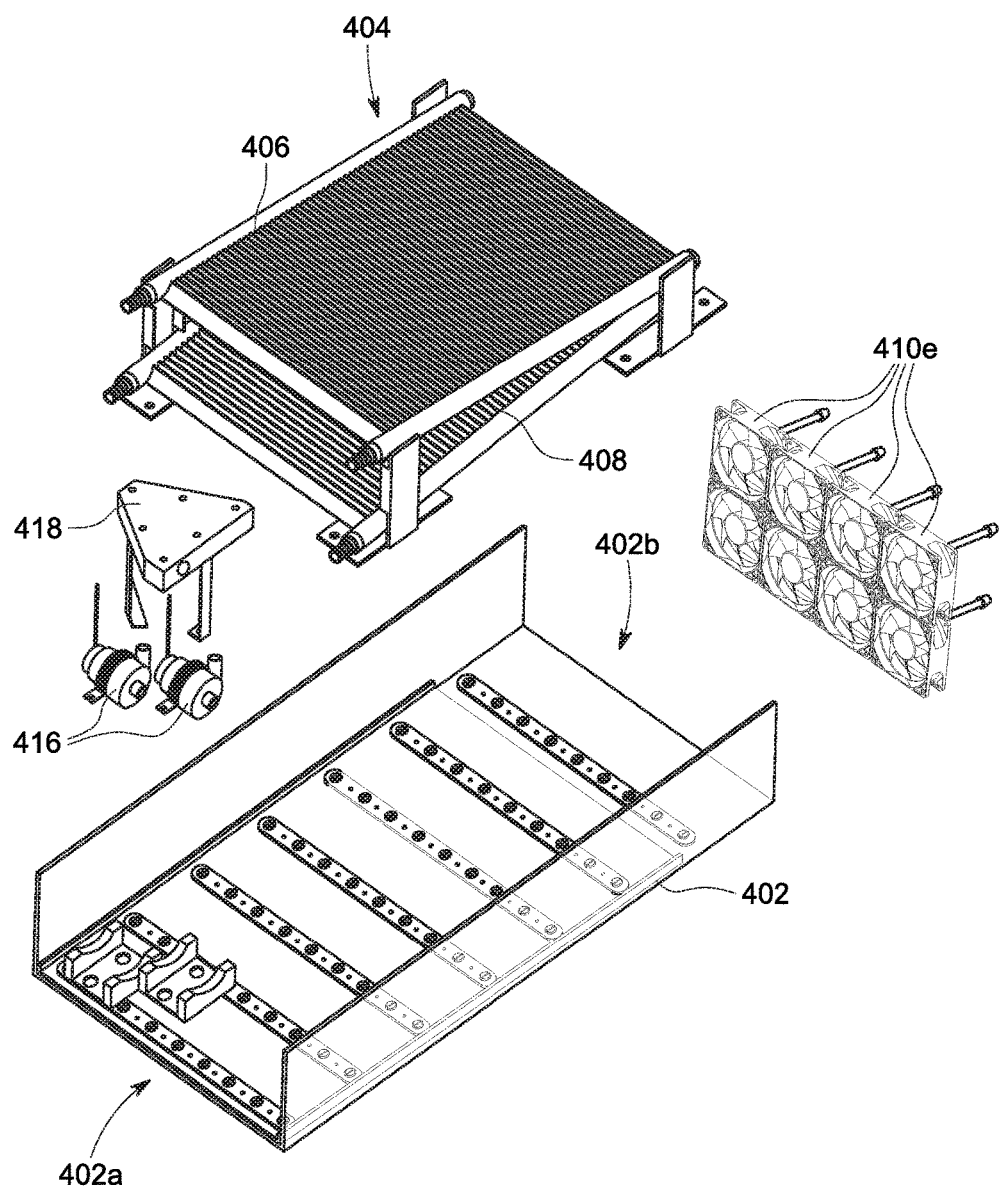
FIG. 4B illustrates an exploded view of the cooling chassis of FIG. 4A.
Figure 4C:
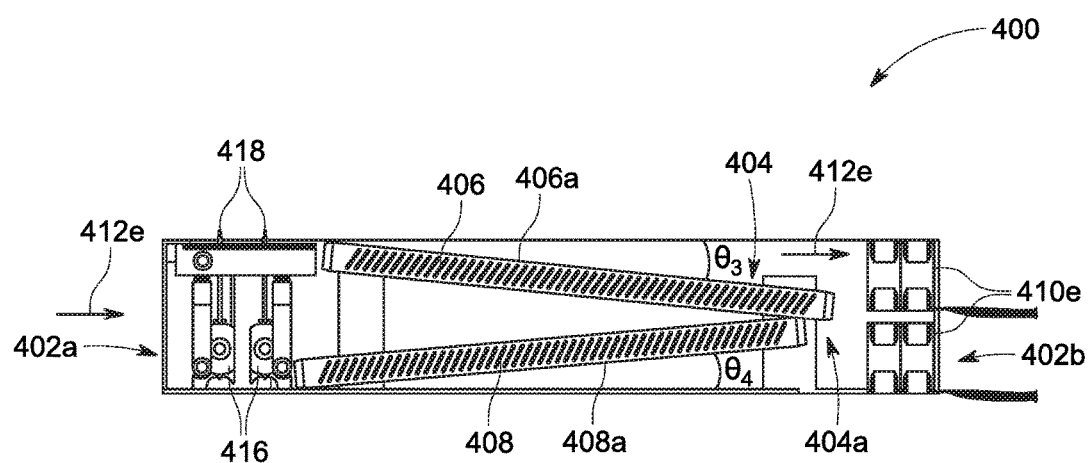
FIG. 4C illustrates a cross-section view of the cooling chassis of FIG. 4A through the line 4C-4C.

FIGS. 4A-4C illustrate a cooling chassis 400 for a cooling system within a computer system for cooling one or more computer components, according to another embodiment of the present disclosure. In particular, FIG. 4A illustrates a perspective view of the cooling chassis 400. FIG. 4B illustrates an exploded view of the cooling chassis 400. FIG. 4C illustrates a cross-section view of the cooling chassis 400 through the line 4C-4C of FIG. 4A. Similar elements within the cooling chassis 400 to the cooling chassis 200 are numbered according to the same numbering scheme. Accordingly, the disclosures above with respect to elements in the cooling chassis 200 that are similar to the elements of the cooling chassis 400 also apply to the elements of the cooling chassis 400.

The cooling chassis 400 includes a housing 402 with a first open end 402a, and a second open end 402b that is opposite to the first open end 402a. The open ends 402a and 402b allow air to flow through the housing 402 in an air flow direction substantially represented by the arrows 412e. Thus, air generally flows into the first open end 402a through the housing 402, and out of the second open end 402b. The air flow direction 412e is parallel to the length 402c of the housing 402.

Within the housing 402 is a radiator system 404. The radiator system 404 exchanges heat between the coolant running through the cooling chassis 400, and air passing through the housing 402 and the radiator system 404. The radiator system 404 includes two separate radiators 406 and 408. The radiators 406 and 408 are planar in shape and are tilted at an oblique angle relative to the air flow direction 412e through the housing 402. More specifically, the plane 406a (FIG. 4C) defined by the radiator 406 is angled at an angle $\theta_3$, relative to the air flow direction 412e through the housing 402. The plane 408a (FIG. 4C) defined by the radiator 208 is angled at an angle $\theta_4$, relative to the air flow direction 412e through the housing 402. In one or more embodiments, the angles $\theta_3$ and $\theta_4$ can be the same value or different values. For example, the angle $\theta_3$ can be about 5° to less than 90°, and the angle $\theta_4$ can be about 5° to less than 90°.

As discussed above, the angles $\theta_3$ and $\theta_4$ orient the radiators 406 and 408 in a V-shape, such that the radiator system 404 forms a V-shaped structure. The vertex 404*a* of the V-shaped radiator system 404 is oriented in the air flow direction 412*e*, as illustrated in FIG. 4C.

The cooling chassis 400 further includes pumps 416 that circulate coolant through the radiator system 404, according to the arrows 414*a* and 414*b*. Specifically, the radiators 406 and 408 can be configured so that the coolant comes in at right of the radiators 406 and 408, through the tubes 420*a*, and according to arrow 414*a*; and exits at the left of the radiators 406 and 408, through the tubes 420*b*, and according to arrow 414*b*. The cooling chassis 400 can further include a redundancy tank 418 where the coolant can collect prior to being circulated through the radiators 406 and 408. The redundancy tank 418 allows for the flow of coolant through the radiators 406 and 408 in the event that, for example, one of the pumps 416 fails or one of the tubes 420*a* becomes blocked.

Unlike the cooling chassis 200, the cooling chassis 400 has only fans 410*e* at the open end 402*b*. The fans 410*e* are configured to direct air through the radiators 406 and 408 at an oblique angle based on the radiators 406 and 408 being at an oblique angle relative to the air flow direction 412*e*. The fans 410*e* are arranged in two stacked rows of five fans each. However, although only ten fans are illustrated in FIGS. 4A and 4B, there can be less than or more than ten fans 410*e*, e.g., five fans, six fans, seven fans, eight fans, nine fans, eleven fans, twelve fans, etc. The fans 410*e* can be coupled to the housing 402, the radiator 406, the radiator 408, or a combination thereof.

As illustrated in FIGS. 4A-4C, the fans 410*e* can be sized relative to the size of the housing 402 to prevent air from flowing through the housing 402 without passing through one of the fans 410*e*. For example, referring to FIG. 4C, there is no direct path for air to flow through the housing 402, from the open end 402*a* to the open end 402*b*, and while remaining parallel to the air flow direction 412*e*, without passing through one of the fans 410*e*.

Figure 5:
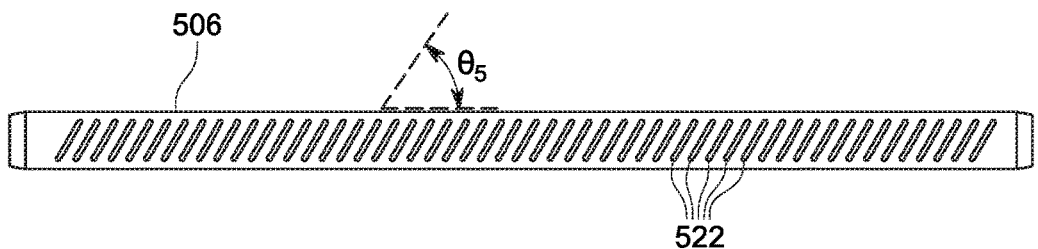
FIG. 5 illustrates a perspective view of a radiator according to one embodiment of the present disclosure.

FIG. 5 illustrates a side view of a radiator 506 according to one embodiment of the present disclosure. The radiator 506 can be any one of the radiators 206, 208, 406, and 408. The radiator 506 includes fins 522 through which the coolant flows through. The air passes over the fins 522 to exchange heat between the air and the coolant. The fins 522 can be titled at an angle $\theta_5$ relative to the length of the radiator 506 for reducing the air flow impedance across the radiator 506. The angle $\theta_5$ can be the same or different than the angles of $\theta_1$, $\theta_2$, $\theta_3$, or $\theta_4$ discussed above.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A cooling chassis for cooling a computer system comprising:
    a housing configured to allow air to pass through in a housing air flow direction;
    a first radiator within the housing, the first radiator being oriented at a first oblique angle relative to the housing air flow direction;
    a first fan configured to direct air through the first radiator in a first fan air flow direction oblique to the housing air flow direction; and
    a second fan configured to direct air at least partially through the first radiator in a second fan air flow direction, parallel to the housing air flow direction.

2. The cooling chassis of claim 1, wherein the first radiator is planar, and a first plane defined by the first radiator is oriented at the first oblique angle relative to the housing air flow direction.

3. The cooling chassis of claim 1, wherein the first fan air flow direction is perpendicular to the first radiator.

4. The cooling chassis of claim 1, wherein the first fan is coupled to the first radiator.

5. The cooling chassis of claim 1, further comprising:
    a second radiator within the housing, the second radiator being oriented at a second oblique angle relative to the housing air flow direction.

6. The cooling chassis of claim 5, wherein the second radiator is substantially planar, and a second plane defined by the second radiator is oriented at the second oblique angle relative to the housing air flow direction.

7. The cooling chassis of claim 5, wherein the second oblique angle is substantially equal to the first oblique angle.

8. The cooling chassis of claim 7, further comprising:
    a third fan configured to direct air through the second radiator in a third fan air flow direction, oblique to the housing air flow direction.

9. The cooling chassis of claim 5, wherein the first radiator and the second radiator form a V-shaped radiator system, and the vertex of the V-shaped radiator system is oriented in the housing air flow direction.

10. The cooling chassis of claim 1, wherein the first fan comprises a plurality of fans.

11. The cooling chassis of claim 1, wherein the first oblique angle is about 5° to less than 90°.

12. The cooling chassis of claim 1, wherein the housing air flow direction substantially corresponds and is parallel to a length of the housing.

13. A cooling chassis for a cooling system in a server computer system, the cooling chassis comprising:
- a housing having a first open end and a second open end, opposite the first open end, the housing further having a length, from the first open end to the second open end, substantially corresponding to a housing air flow direction through the housing;
- a radiator system within the housing, the radiator system having a first radiator tilted at a first oblique angle relative to the air flow direction and a second radiator titled at a second oblique angle relative to the air flow direction;
- a first plurality of fans adjacent to the first radiator and configured to direct air flow perpendicularly through the first radiator in a first fan air flow direction;
- a second plurality of fans coupled to the second radiator and configured to direct air flow perpendicularly through the second radiator in a second fan air flow direction; and
- a third plurality of fans within the housing and between the first radiator and the second radiator, the third plurality of fans being configured to direct air flow through the first radiator and the second radiator in the air flow direction.

14. The cooling chassis of claim 13, wherein the first radiator is substantially planar, and a first plane defined by the first radiator is oriented at the first oblique angle relative to the housing air flow direction, and the second radiator is substantially planar, and a second plane defined by the second radiator is oriented at the second oblique angle relative to the housing air flow direction.

15. The cooling chassis of claim 13, wherein the first radiator and the second radiator form a V-shape, and the vertex of the V-shape is oriented in the housing air flow direction.

16. The cooling chassis of claim 13, wherein the first oblique angle is about 5° to less than 90° relative to the housing air flow direction, and the second oblique angle is about 5° to less than 90° relative to the housing air flow direction.

17. The cooling chassis of claim 13, wherein the third plurality of fans is in a farthest forward position between the first radiator and the second radiator.

18. The cooling chassis of claim 17, wherein the first plurality of fans is in a farthest back position relative to the first radiator.

19. The cooling chassis of claim 18, wherein the second plurality of fans is in a farthest back position relative to the second radiator.

\* \* \* \* \*